United States Patent [19]

Matsui et al.

[11] Patent Number: 4,856,015
[45] Date of Patent: Aug. 8, 1989

[54] SEMICONDUCTOR LASER ARRAY DEVICE

[75] Inventors: Sadayoshi Matsui, Nara; Mototaka Taneya, Ibaragi; Mitsuhiro Matsumoto; Hiroyuki Hosoba, both of Nara, all of Japan

[73] Assignee: Sharp Kabushiki Kaisha, Osaka, Japan

[21] Appl. No.: 203,469

[22] Filed: Jun. 7, 1988

[30] Foreign Application Priority Data

Jun. 19, 1987 [JP] Japan ................... 62-153843

[51] Int. Cl.⁴ ............................................. H01S 3/19
[52] U.S. Cl. ...................................... 372/50; 372/36; 372/97; 372/46; 357/81
[58] Field of Search ............... 372/36, 50, 97, 46; 357/81

[56] References Cited

U.S. PATENT DOCUMENTS 4,589,116 5/1986 Westermeier ..................... 372/36

OTHER PUBLICATIONS

Taneya et al., "Phased-Array with YY Shaped Symmetrically Branching Waveguide (SBW)", Japanese Journal of Applied Physics, Jun. 1986, (25) pp. 432-434.

Primary Examiner—William L. Sikes
Assistant Examiner—Georgia Y. Epps
Attorney, Agent, or Firm—Flehr, Hohbach, Test, Albritton & Herbert

[57] ABSTRACT

A semiconductor laser array device has a relatively wide light-emitting area with many semiconductor lasers and a shielding layer selectively disposed with respect to peripheral regions of the light-emitting area such that the rate of heat emission from the center part can be increased relative to that from the peripheral regions. Temperature distribution on the light-emitting area can thus be made uniform and laser light can be emitted from the entire laser emitting area under a phase-synchronized condition.

9 Claims, 6 Drawing Sheets

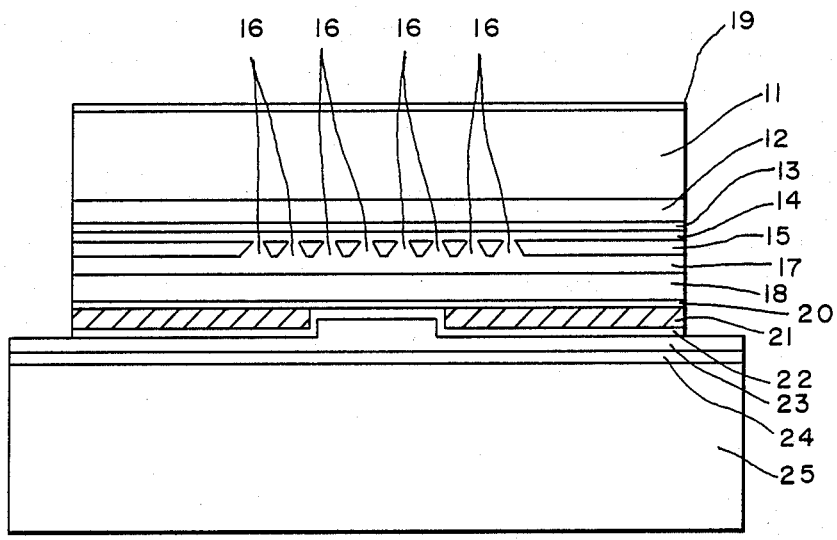
FIG.—1A
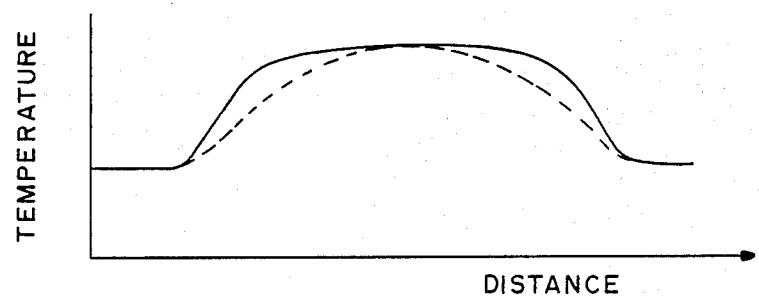
FIG.—1B

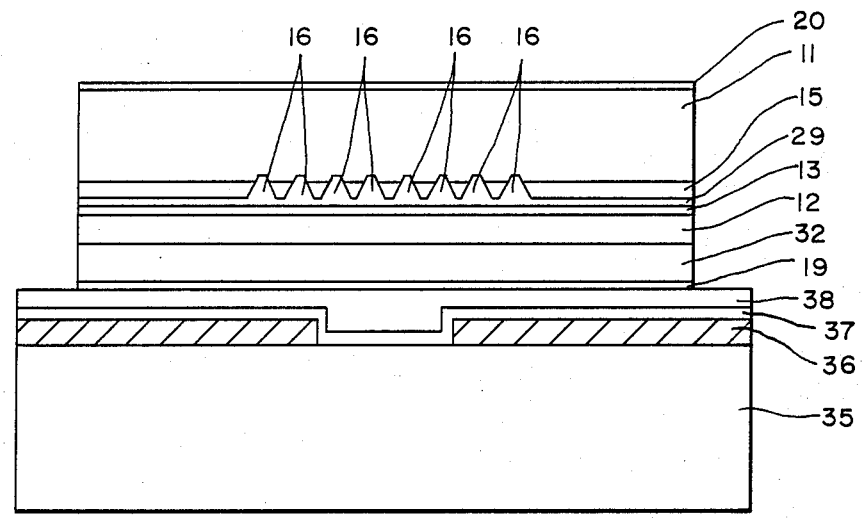
FIG.— 2
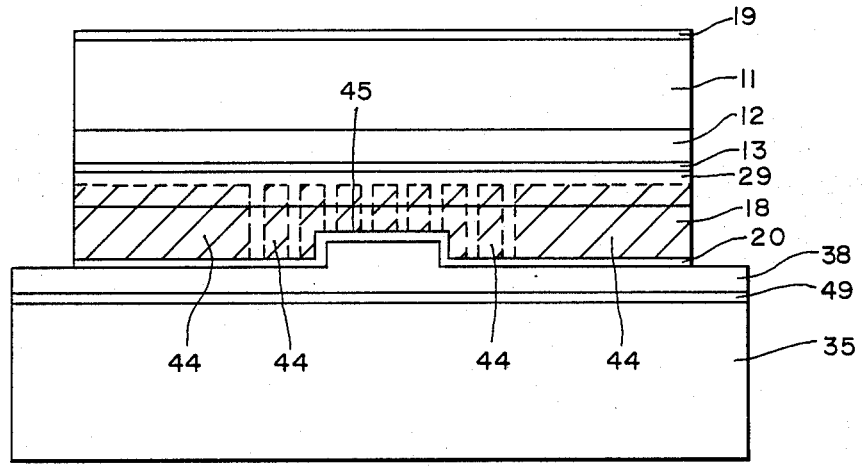
FIG.— 3

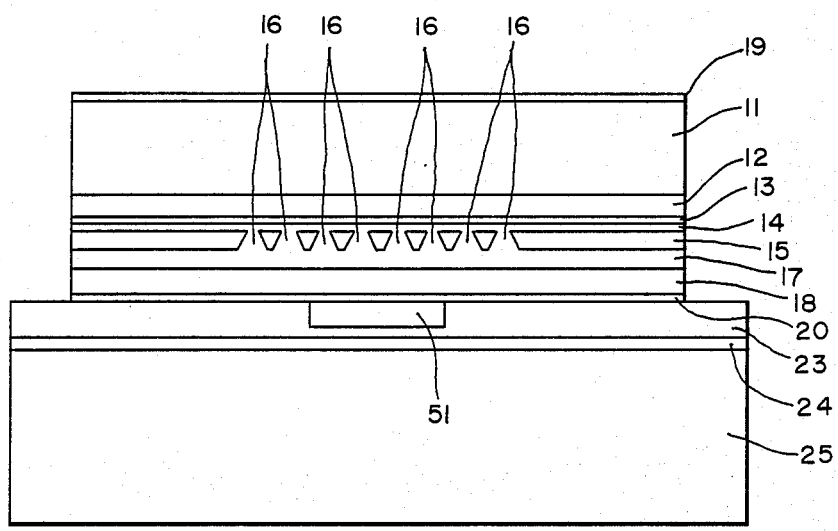
FIG.—4A
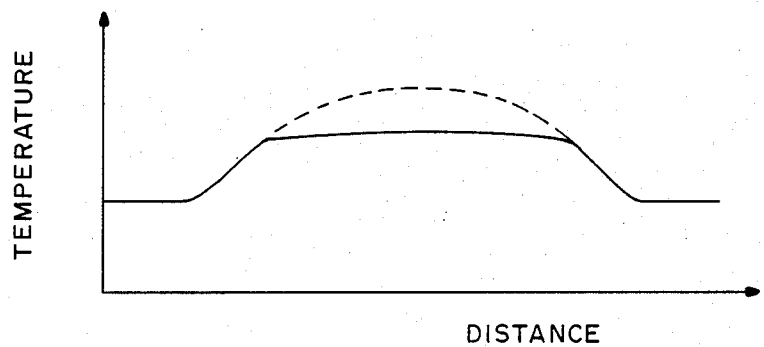
FIG.—4B

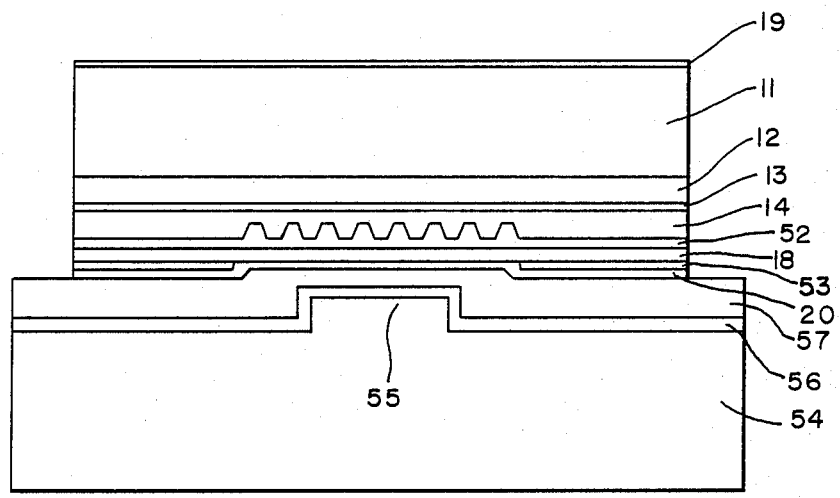
FIG.— 5
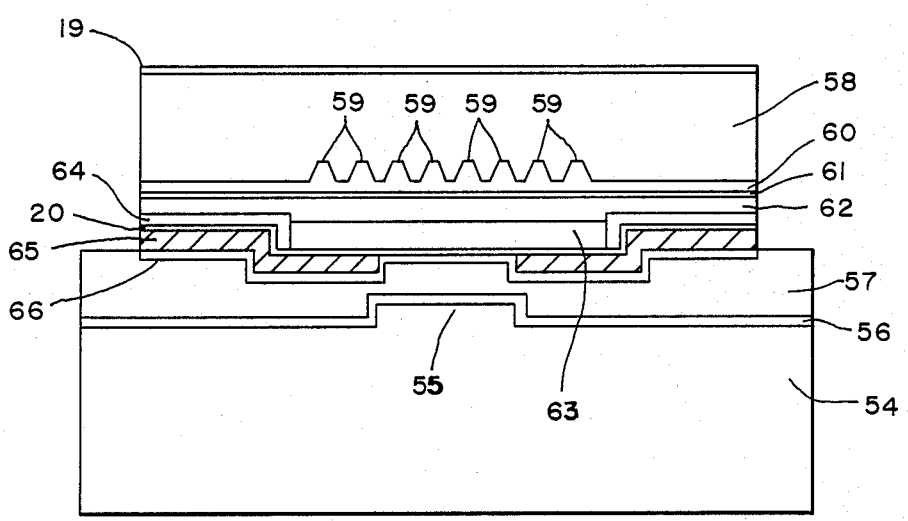
FIG.— 6

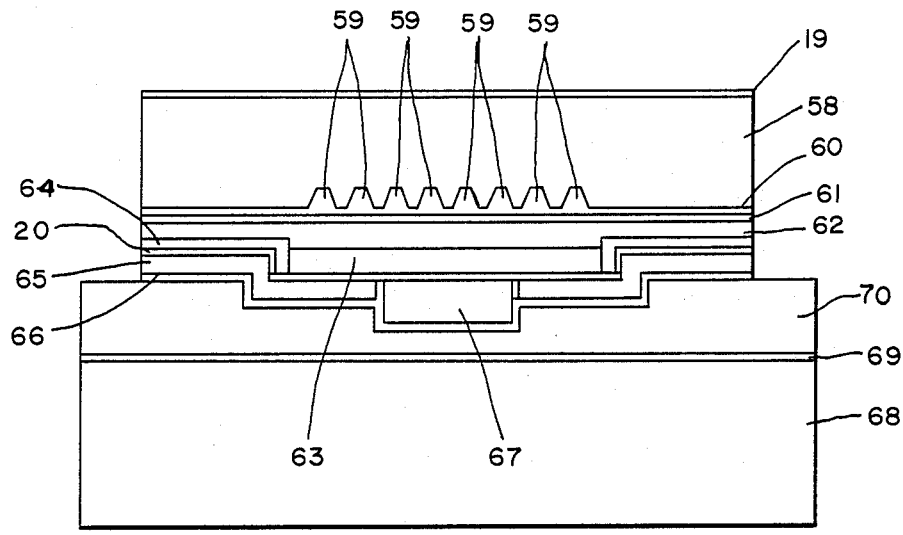
FIG.—7
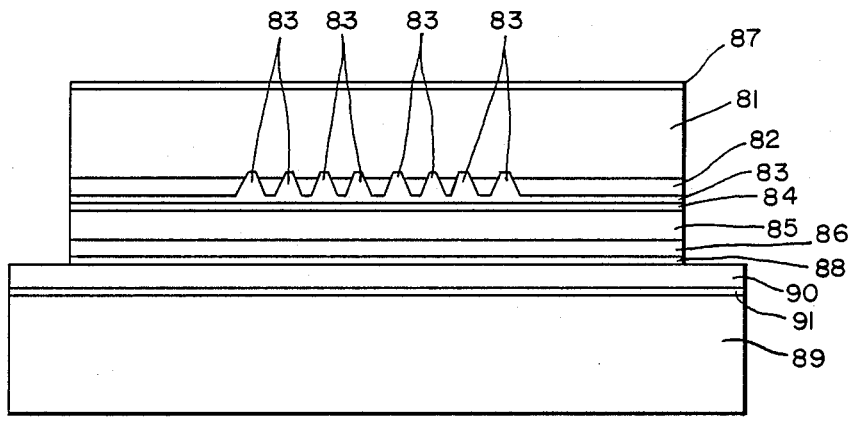
(PRIOR ART)
FIG.—8A

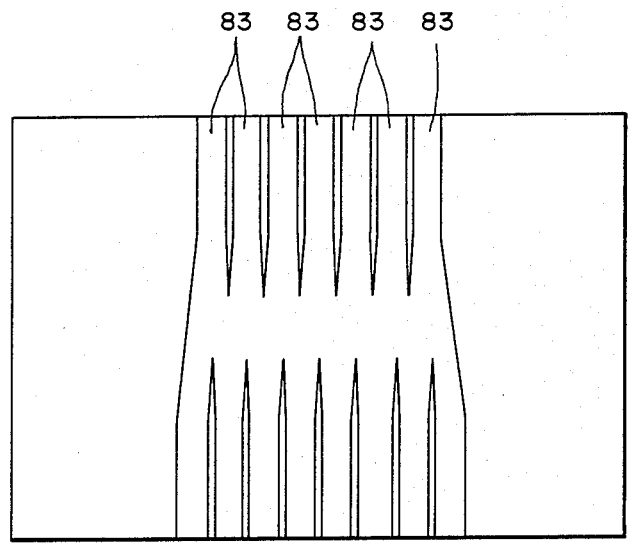
(PRIOR ART)
FIG.—8B
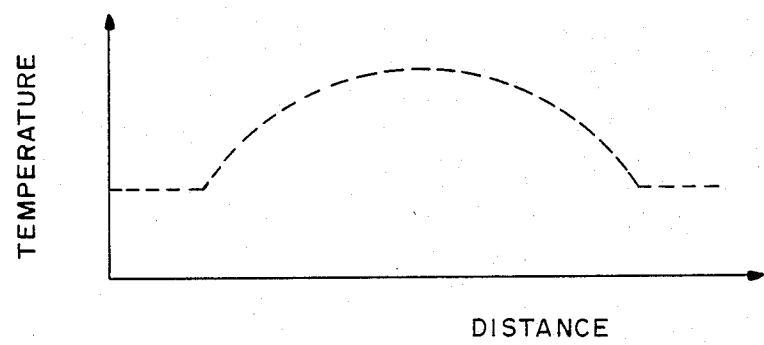
(PRIOR ART)
FIG.—8C

SEMICONDUCTOR LASER ARRAY DEVICE

BACKGROUND OF THE INVENTION

This invention relates to the structure of a semiconductor laser array device.

There have been many researches to develop a high-output semiconductor laser array device with a plurality of optically connected semiconductor lasers disposed on a single substrate. Since the light-emitting area of a semiconductor laser array may be as wide as several μm to several hundred μm, temperature of the active region of the semiconductor lasers tends to become higher near the center of such a light-emitting area of an array than at its peripheral regions by several degrees when the device is operating at a high output rate. This causes the wavelength of laser oscillations or the constant of propagation to become different between the center and peripheral regions of the light-emitting area. In other words, the oscillations are no longer in phase or in synchronism over the entire light-emitting area of the array.

Before the distinguishing characteristics of the present invention are explained, formation of a semiconductor laser array device according to a previously considered design is described below by way of FIGS. 8A and 8B. As shown more clearly in FIG. 8A, a current-narrowing layer 82 of n-type GaAs (or GaAlAs) is formed by a liquid phase epitaxial growth method on a p-type GaAs substrate 81 and grooves 83 penetrating the n-type GaAs (or GaAlAs) are thereafter formed by photolithography and etching technologies on the substrate surface. FIG. 8B shows the grooves 83 thus formed as seen from above. Next, a p-$Ga_{1-x}Al_xAs$ cladding layer 83, a p-(or n-) $Ga_{1-y}Al_yAs$ active layer 84, an n-type $Ga_{1-x}Al_xAs$ cladding layer 85 and an n$^+$-GaAs capping layer 86 are sequentially formed by liquid phase epitaxial growth method, where $0 \leq y \leq x \leq 1$. After electrodes 87 and 88 are formed on both sides and resonance surfaces are formed by cleaving, individual laser array elements are partitioned. Thereafter, it is brazed onto a heat sink 89 of copper, diamond or the like by using a soldering material 90 such as indium or a gold-tin alloy such that the heat generated near the active layer 84 at the time of laser oscillations can be effectively removed. A gold alloy layer 91 is formed on the heat sink 89 in order to improve its current flow characteristics and contact with the brazing material.

When a phase-synchronized laser array device thus formed and having a wide light-emitting area is operated under a condition of high optical output, the temperature distribution in the vicinity of the active layer 84 becomes as shown in FIG. 8C, temperature being higher near the center and lower at peripheral regions. The temperature difference can be as large as several degrees. The temperature-dependence of oscillating wavelength of a semiconductor laser is on the order of about 1Å/°C. and mutually adjacent laser light-emitting areas cannot oscillate under a phase-synchronized condition if the difference in oscillation wavelength between them becomes about 0.3Å or greater. As a result, oscillations cannot be obtained from the entire light-emitting area in one axial mode nor in a single transverse mode. Thus, it becomes difficult to use a lens to focus the beams to the diffraction limit and the optical output becomes unstable because of the transverse modes which are mixed in the oscillations. Moreover, there will be more noise in the optical output and the operation lifetime will become shorter.

SUMMARY OF THE INVENTION

It is therefore an object of the present invention to provide a semiconductor laser device which has a wide light-emitting area, for example, with a plurality of optically connected semiconductor lasers disposed on a single substrate and is capable of oscillating in a phase-synchronized mode over its entire width.

The above and other objects of the present invention are achieved by providing a temperature compensating means to such a semiconductor laser array device with a wide light-emitting area for causing heat to be removed from the light-emitting area at different rates between the center and the peripheral regions such that temperature will remain uniform throughout the light-emitting area. With a semiconductor laser array device thus structured, laser oscillations under a phase-synchronized condition can be achieved from its entire light-emitting area because temperature can be maintained uniformly throughout the area even when the device is operated at a high output rate and the axial modes of oscillation from the individual laser light emitting areas match one another.

BRIEF DESCRIPTION OF THE DRAWINGS

The accompanying drawings, which are incorporated in and form a part of the specification, illustrate several embodiments of the present invention and, together with the description, serve to explain the principles of the invention. In the drawings:

FIG. 1A is a drawing showing schematically the layer structure of a semiconductor laser array device embodying the present invention and FIG. 1B is a graph of temperature distribution on the light-emitting area of the device of FIG. 1A during its operation, FIG. 2 is a drawing showing schematically the layer structure of another semiconductor laser array device embodying the present invention, FIG. 3 is a drawing showing schematically the layer structure of still another semiconductor laser array device embodying the present invention, FIG. 4A is a drawing showing schematically the layer structure of still another semiconductor laser array device embodying the present invention and FIG. 4B is a graph of temperature distribution on the light-emitting area of the device of FIG. 4A, FIG. 5 is a drawing showing schematically the layer structure of still another semiconductor laser array device embodying the present invention, FIG. 6 is a drawing showing schematically the layer structure of still another semiconductor laser array device embodying the present invention, FIG. 7 is a drawing showing schematically the layer structure of still another semiconductor laser array device embodying the present invention, and FIG. 8A is a drawing showing schematically the layer structure of a previously considered semiconductor laser array device, FIG. 8B is its plan view to show its light conducting paths, and FIG. 8C is a graph of temperature distribution on the light-emitting area of the device of FIG. 8A.

DETAILED DESCRIPTION OF THE INVENTION

In what follows, the present invention is described by way of examples. FIG. 1A shows a semiconductor laser array device embodying the present invention produced by an organometallic chemical deposition method. After an n-GaAs substrate 11, an n-$Ga_{1-x}Al_xAs$ cladding layer 12, an n-(or p-) $Ga_{1-y}Al_yAs$ active layer 13, a first p-$Ga_{1-x}Al_xAs$ cladding layer 14 and an n-GaAs (or BaAlAs) current-narrowing and light-absorbing layer 15 are formed, lithographic and chemical etching technologies are used to form grooves 16 which not only serve as electric current paths but also form light conducting paths. Thereafter, a second p-$Ga_{1-x}Al_xAs$ cladding layer 17 and a p-GaAs capping layer 18 are sequentially grown epitaxially again by an organometallic chemical deposition method. Electrodes 19 and 20 are thereafter formed on both surfaces In FIG. 1A, numeral 23 indicates a layer of brazing material and numeral 25 indicates a heat sink. Numeral 21 indicates a film of a material having smaller thermal conductivity than the brazing material 23 or the heat sink 25 and formed on the electrode 20. According to an embodiment of the present invention, the brazing material 23 is indium and copper is used for the heat sink 25. Thus, $SiN_2$ with thermal conductivity smaller than indium or copper by an order of magnitude is selected as the material for this film layer 21. After a center region of the light-emitting area is removed by lithography and chemical etching technologies, a molybdenum-gold electrode layer 22 is formed by brazing.

Next, oscillator end surfaces are formed by cleaving and after protective films of $Al_2O_3$ or the like are formed on these end surfaces, the product is divided into individual laser array elements. Thereafter, the indium layer 23 is formed on the heat sink 25 with a molybdenum-gold layer 24 thereon and it is brazed onto the molybdenum-gold electrode layer 22 of the semiconductor laser array elements.

According to one embodiment of the present invention, the wave conducting paths formed by the grooves 16 were as shown in FIG. 8B with the path width of 3 $\mu$m and their pitch was 5 $\mu$m. Use was made of eight such paths on the front side and nine on the back side. The $SiN_2$ film layer 21 was formed to the thickness of 3000Å over a total of four peripheral wave conducting paths at both ends. With a semiconductor laser array device thus structured, the temperature distribution was as shown by the solid line in FIG. 1B with the temperature variation less than 0.2° C. The dotted line in FIG. 1B is the temperature distribution shown in FIG. 8C relating to a device with no temperature compensating means of the present invention. The two curves in FIG. 1B clearly show the temperature compensating effect of the $SiN_2$ film layer 21 and phase-synchronized oscillations can be obtained from the entire light-emitting area.

FIG. 2 shows another semiconductor laser array device embodying the present invention with laser array elements of a current-narrowing type formed by a liquid phase epitaxial growth method. In FIG. 2, the layers of the laser array elements which are substantially identical to those shown in FIG. 1A are indicated by the same numerals. Numeral 29 indicates a p-GaAlAs cladding layer and numeral 32 indicates an n-GaAs capping layer. Numeral 36 indicates an $Al_2O_3$ film layer formed to a thickness of 2000Å to cover the light-emitting area except a stripe-like section of width of about 20 $\mu$m at the center corresponding to the light conducting paths in the light-emitting area is removed. Numeral 35 indicates a diamond heat sink. After this $Al_2O_3$ film layer 36 is formed on the heat sink 35, the entire surface of the heat sink 35 is covered by a molybdenum-gold electrode layer 37 for attaching a brazing material thereonto and this combination is then brazed to the laser array elements by using a gold-tin layer 38 as brazing material. Since the thermal conductivity of the $Al_2O_3$ film layer 36 is smaller than that of a gold-tin alloy or diamond, temperature of the light-emitting area in its peripheral regions is raised as shown in FIG. 1B and a uniform temperature distribution can be obtained throughout the light-emitting area.

FIG. 3 shows still another semiconductor laser array device with a laser array element of an ordinary double heterojunction structure. After the laser array element is formed, protons are injected to a depth of 3 $\mu$m by an ion implantation method to make a high-resistance region 44 as shown for providing limited current paths. Thereafter, a portion of the p-GaAs capping layer 18 corresponding to four of the current paths at the center part of the high-resistance region 44 is etched to create a stripe-shaped groove 45 of width 40 $\mu$m and depth 1 $\mu$m. After the electrodes 19 and 20 are formed, the product is cleaved, end surface protective films are formed, and the layers are divided into individual elements. Numeral 35 again indicates a diamond heat sink, covered with a molybdenum-gold layer 49. After a gold-tin layer 38 is attached as a brazing material, the semiconductor laser array elements are brazed thereonto. Since GaAs is thermally less conductive than diamond or gold-tin alloys, a uniform temperature distribution as shown in FIG. 1B is also obtained on the entire light emitting surface of the device shown in FIG. 3.

FIG. 4A shows a semiconductor laser array device according to a fourth embodiment of the present invention with semiconductor laser array elements formed by an organometallic deposition method as explained above by way of FIG. 1A. This device is characterized as having a stripe-shaped copper layer 51 of width 20 $\mu$m and thickness 3 $\mu$m formed on the electrode 20 corresponding to four of the light conducting paths at the center part of the light-emitting area. Numerals 23, 24 and 25 again indicate indium as a brazing material, a molybdenum-gold layer and a copper heat sink, respectively. Since copper is thermally more conductive than indium by a factor of about 20, heat is removed more effectively from the center part of the light-emitting area corresponding to the copper layer 51. This has the effect of lowering the temperature of the light-emitting area near the center. The resultant temperature distribution of the light-emitting area is shown by a solid line in FIG. 4B, which is flatter than the dotted line copied from FIG. 8C for comparison.

FIG. 5 shows a semiconductor laser array device according to a fifth embodiment of the present invention with semiconductor laser array elements of an ordinary heterojunction structure formed by an organometallic deposition method. Its light-conducting paths are formed by etching the first p-$Ga_{1-x}Al_xAs$ cladding layer 14 to form ridges thereon and thereafter epitaxially growing a third p-$Ga_{1-y}Al_xAs$ cladding layer 52 and the p-GaAs capping layer 18. Because of the difference in mixing ratio of Al between the first and third cladding layers 14 and 52 ($x \neq y$), a difference in the coefficient of refraction results in the transverse direction, thereby providing a light conducting paths. After a current-narrowing layer 53 of a $SiN_4$ or $Si_3N_4$ film is formed on the p-GaAs capping layer 18 except the region corresponding to the light-emitting area, the electrodes 19 and 20 are formed to make the laser array elements.

Numeral 54 indicates a copper heat sink. After a stripe-shaped protruding part 55 of width 20 μm and height 3 °m is formed thereon corresponding to the central region of the light-emitting area of the semiconductor laser array, a molybdenum-gold layer 56 and an indium material 57 are piledon top thereof, and the heat sink 54 thus prepared is brazed to the laser array elements such that four of the light conducting paths at the center of the laser array match the protruding part 55 of the heat sink 54. In this case, too, since the copper heat sink 54 is thermally more conductive than the indium layer 57, heat is removed more efficiently from the central part of the light-emitting area of the semiconductor laser array and the resultant temperature distribution of the light-emitting area appears flat as shown in FIG. 4B.

FIG. 6 shows a semiconductor laser array device according to a sixth embodiment of the present invention formed by a liquid phase epitaxial growth method. After grooves 59 are formed on an n-GaAs substrate 58 by chemical etching to provide light conducting paths, an n-Ga$_{1-x}$Al$_x$As cladding layer 60, an n-(or p-)p-Ga$_{1-y}$Al$_y$As active layer 61, a p-Ga$_{1-x}$Al$_x$As cladding layer 62 and a p-GaAs capping layer 63 are sequentially formed by epitaxial growth method. Thereafter, a part of the capping layer 63 corresponding to the light-emitting area is left but the remaining parts thereof as well as a portion of the cladding layer 62 are removed by a chemical etching method until the p-Ga$_{1-x}$Al$_x$As cladding layer 62 is reached. After a mesa-like stripe is thus formed, a SiN$_4$ film 64 is formed on surfaces other than this mesa-like stripe as shown and the electrodes 19 and 20 are formed as in the other embodiments.

Next, an Al$_2$O$_3$ film 65 is formed on the electrode 20 exclusive of the center part of the light-emitting area such that heat is removed less efficiently from its peripheral regions and a molybdenum-gold layer 66 is formed thereover. A copper heat sink 54 having a stripe-shaped protrusion 55 as explained above by way of FIG. 6 is thereafter attached through an indium layer 57 such that the protrusion 55 is aligned with the center part of the light-emitting area. As a result, heat is removed at a higher rate from the center part of the light-emitting area through the protrusion 55 of the copper heat sink 54 while the flow of heat is obstructed by the Al$_2$O$_3$ film 65 in the peripheral regions.

FIG. 7 shows a semiconductor laser array device according to a seventh embodiment of the present invention with semiconductor laser array elements formed by liquid phase epitaxial growth. This device is similar to the one described above by way of FIG. 6 except, after the Al$_2$O$_3$ film 65 is formed for preventing propagation of heat, a stripe-shaped copper layer 67 is formed by plating at a position corresponding to the center part of the light-emitting area and it is thereafter brazed onto a diamond heat-sink 68 with a molybdenum-gold layer 69 formed thereon by using a gold-tin layer 70 in between.

The foregoing description of preferred embodiments of the invention has been presented for purposes of illustration and description. It is not intended to be exhaustive or to limit the invention to the precise forms disclosed, and many modifications and variations are possible in light of the above teaching. For example, the present invention is not limited to semiconductor laser array elements having light conducting paths structured as shown in FIG. 8B. The paths may be mutually parallel, or there may be a relatively wide light conducting path with one part thereof containing a plurality of mutually parallel narrower paths. Moreover, the present invention is not limited to GaAs-GaAlAs type semiconductor laser arrays. It is applicable equally effectively to laser arrays of the InGaAsP-InP type. Although copper and diamond were used as examples of an effective heat conductor, use may also be made of other materials such as silver and gold. Examples of material with low thermal conductivity include iron and SiO$_2$. In summary, the present invention teaches the use of a temperature compensating means in a semiconductor laser array device with a wide light-emitting area such that a uniform temperature is obtained over the entire light-emitting area and laser light can be emitted under a phase-synchronized condition from the entire light-emitting area. Such temperature compensating means may take the form of a thermally conductive material placed against the center part of the light-emitting area such that heat can be removed more effectively therefrom or a poor thermal conductor selectively covering the peripheral regions of the light-emitting area. Any modifications and variations that may be skilled in the art are intended to be included within the scope of this invention.

What is claimed is:

1. In a semiconductor laser array device having a light-emitting area having thereon a plurality of semiconductor laser channels, the improvement wherein said semiconductor laser array device further comprises temperature compensating means having non-uniform thermal conductivity and disposed near said light-emitting area for making the temperature distribution uniform over said plurality of semiconductor laser channels on said light-emitting area.

2. The semiconductor laser array device of claim 1 wherein said temperature compensating means have relatively smaller thermal conductivity near peripheral regions of said light-emitting area than near central regions of said light-emitting area, thereby serving to effectively reduce heat emission from said peripheral regions of said light-emitting area compared to heat emission from said central regions of said light-emitting area.

3. The semiconductor laser array device of claim 1 further comprising a heat sink of a thermally conductive material having a contact surface substantially parallel to said light-emitting area and a shielding layer of a thermally less conductive material disposed between said contact surface and peripheral regions of said light-emitting area.

4. The semiconductor laser array device of claim 3 wherein said shielding layer comprises Al$_2$O$_3$.

5. The semiconductor laser array device of claim 2 wherein said temperature compensating means include an indium layer with increased thickness corresponding to said central regions and a SiN$_2$ layer with thermal conductivity smaller than indium disposed between said indium layer and said light-emitting area corresponding to said peripheral regions.

6. The semiconductor laser array device of claim 2 wherein said temperature compensating means include an Al$_2$O$_3$ layer corresponding to said peripheral regions and a gold-tin layer with increased thickness corresponding to said central regions and disposed between said Al$_2$O$_3$ layer and said light-emitting area.

7. The semiconductor laser array device of claim 2 wherein said temperature compensating means include an indium layer having a copper layer embedded therein at an area corresponding to said central regions.

8. The semiconductor laser array device of claim 2 wherein said temperature compensating means include an indium layer with a reduced thickness at an area corresponding to said central regions, said indium layer being formed on top of a copper heat sink having a protrusion at an central area corresponding to said central regions of said heat-emitting surface.

9. The semiconductor laser array device of claim 2 wherein said temperature compensating means include a gold-tin layer with reduced thickness near said central regions and a copper layer disposed near said central regions and between said gold-tin layer and said light-emitting surface.

* * * * *